(12) United States Patent
Okihara

(10) Patent No.: US 8,217,361 B2
(45) Date of Patent: Jul. 10, 2012

(54) ULTRAVIOLET SENSOR

(75) Inventor: Masao Okihara, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 410 days.

(21) Appl. No.: 12/230,976

(22) Filed: Sep. 9, 2008

(65) Prior Publication Data

US 2009/0078880 A1    Mar. 26, 2009

(30) Foreign Application Priority Data

Sep. 21, 2007  (JP) ................ 2007-246207

(51) Int. Cl.
*G01J 1/42* (2006.01)
(52) U.S. Cl. .............. 250/372; 250/378; 250/338.4; 250/370.01
(58) Field of Classification Search ............ 250/372, 250/378, 338.4, 370.01
See application file for complete search history.

(56) References Cited

U.S. PATENT DOCUMENTS 5,214,176 A * 5/1993 Soula et al. ............. 556/404
7,189,952 B2 * 3/2007 Guedj et al. ............ 250/208.1

FOREIGN PATENT DOCUMENTS

| JP | 64-002377 | 1/1989 |
|----|-----------|--------|
| JP | 3471394 | 9/2003 |
| JP | 2006-237576 | 9/2006 |

OTHER PUBLICATIONS

Lin et al.; GaN PIN photodetectros with an Lt-GaN interlayer; 2007; IET Optoelectronics, vol. 2, No. 2, pp. 59-62.*
Afzalian, A, "Physical Modeling and Design of Thin-Film SOI Lateral PIN Photodiodes", IEEE Transactions on Electron Devices, vol. 52, No. 6, Jun. 2005, pp. 1116-1122.

* cited by examiner

*Primary Examiner* — David Porta
*Assistant Examiner* — Djura Malevic
(74) *Attorney, Agent, or Firm* — Rabin & Berdo, P.C.

(57) ABSTRACT

An ultraviolet sensor has an ultraviolet detection diode having a depletion region 18 formed in an Si layer 16 on an insulating layer 14, an interlayer insulating film 20 formed on the ultraviolet detection diode, and a wiring 24 formed on the interlayer insulating film 20. An incident angle θ (°) of an incident light entering into the depletion region 18 and a film thickness $T_{si}$ (nm) of the depletion region 18 satisfy the following formula (1), which is also shown in FIG. 14.

$$T_{Si} \leq T_{Si}/\sin\theta \leq 100 \quad \text{(Formula 1)}$$

8 Claims, 14 Drawing Sheets

FIG. 14

$$T_{Si} \leq \frac{T_{Si}}{\sin \theta} \leq 100$$

ULTRAVIOLET SENSOR

CROSS REFERENCE TO RELATED APPLICATION

This application claims the priority of Application No. 2007-246207, filed Sep. 21, 2006 in Japan, the subject matter of which is incorporated herein by reference.

TECHNICAL FIELD OF THE INVENTION

The present invention relates to an ultraviolet sensor and a method for setting an ultraviolet sensor, and especially relates to an ultraviolet sensor having a light-shielding part and a method for setting an ultraviolet sensor.

BACKGROUND OF THE INVENTION

Recently, an ultraviolet sensor which performs ultraviolet detection using an Si substrate formed on an insulating substrate uses a lateral PIN diode with a comb-shaped ultraviolet detection part (see, Japanese Patent Application Laid-Open No. 64-2377 and Japanese Patent No. 3471394). The lateral PIN diodes disclosed in these patent documents have a structure in which a PN junction is formed in the Si substrate.

Meanwhile, there is proposed a semiconductor image sensor in which the surrounding of an ultraviolet photosensitive element is covered with a light shielding member, formed of a conductor, to shield oblique incident light (for example, Japanese Patent Application Laid-Open No. 2006-237576).

However, although the ultraviolet sensor having a comb-shaped lateral PIN diode can realize the increasing of a depletion region in the ultraviolet detection part and the improvement of the sensitivity in comparison with a linear diode, the sensitivity may be degraded depending on the incident angle of the incident light entering into the depletion region. Namely, when the incident angle is shallow, the attenuation length of the incident light from entering into the depletion region to be attenuated is increased, and therefore, the ultraviolet sensor responds to the light having a wavelength in a visible light region. Specifically, as shown in FIG. 11, when the attenuation length until the light having a wavelength of 400 nm is attenuated is about 100 nm, and when the attenuation length is larger than 100 nm, the ultraviolet sensor responds to blue visible light.

When the surrounding of the ultraviolet photosensitive element is covered only with the light-shielding member, even if the film thickness of a layer with a photosensitive element is formed therein is reduced, the attenuation length becomes larger than 100 nm depending on the incident angle of the incident light entering the photosensitive element, and the ultraviolet sensor may respond to a wavelength in a visible light region in some cases. Specifically, when the length (attenuation length) until the incident light entering at an incident angle of θ° enters an Si layer 82 and thereafter to abut against an insulating layer 84 is more than 100 nm as shown in FIG. 12, the ultraviolet sensor responds to visible light as shown in FIG. 11. FIG. 13 shows the relation between the incident angle of the incident light in the case in which the film thickness of the Si layer is 30 nm and the actual value of the Si film thickness with respect to the incident angle. As seen in FIG. 13, if the actual value of the Si film thickness is not more than 100 nm, the incident light at an incident angle of 18° or more can enter. There is no problem when there is a clear relation between the incident angle of the incident light and the film thickness of the Si layer. However, when this relation is unclear, there may arise a problem that the photosensitive element responds to blue light.

OBJECTS OF THE INVENTION

An object of the present invention is to provide an ultraviolet sensor, which detects an ultraviolet ray with high sensitivity, and a method for setting an ultraviolet sensor.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

As a result of keen examination, the inventors have found that the above problem is solved by using the following ultraviolet sensor and a method for setting the ultraviolet sensor.

An ultraviolet sensor according to claim 1 has an ultraviolet detection diode having a depletion region formed in an Si layer on an insulating layer, an interlayer insulation film formed on the ultraviolet detection diode, and a wiring formed on the interlayer insulation film. An incident angle θ (°) of incident light entering into the depletion region and a film thickness $T_{si}$ (nm) of a layer with the ultraviolet detection diode formed therein satisfy the following formula (1), which is also shown in FIG. 14.

$$T_{Si} \leq T_{Si}/\sin\theta \leq 100 \quad \text{(Formula 1)}$$

According to the ultraviolet sensor according to claim 1, the attenuation length of the incident light is not more than 100 nm, and therefore, the ultraviolet sensor does not respond to visible light having a wavelength of not less than 400 nm, whereby the ultraviolet sensor can detect an ultraviolet ray with high sensitivity.

In the ultraviolet sensor according to claim 2, the depletion region and the wiring are arranged alternatively, and a distance between an end part of the upper surface on the wiring side in the depletion region and an intersection point between a line, which is drawn from the side surface on the depletion region side in the wiring so as to be vertical with respect to the Si layer direction, and the surface of the Si layer is not less than 0.1 μm and not more than 3.92 μm.

According to the ultraviolet sensor according to claim 2, in addition to the effect of the invention according to claim 1, the distance between the depletion region and the wiring is set in a predetermined range, whereby it is possible to shield the incident light which enters from the lower part of the wiring at an extremely shallow angle.

The ultraviolet sensor according to claim 3 is characterized in that an antireflection film is formed on a side wall of the wiring.

According to the ultraviolet sensor according to claim 3, in addition to the effects of the invention according to claims 1 and 2, the irregular reflection of incident lights reflected onto the side wall of the wiring can be suppressed.

The ultraviolet sensor according to claim 4 is characterized in that a plurality of the wirings are stacked.

According to the ultraviolet sensor according to claim 4, in addition to the effects of the invention according to claims 1 to 3, the height of the wiring can be increased, and therefore, only the incident light at a high incident angle can enter.

Other aspects of this invention are applied to a method for setting an ultraviolet sensor, which has an ultraviolet detection diode having a depletion region formed in an Si layer on an insulating layer, an interlayer insulation film formed on the ultraviolet detection diode, and a wiring formed on the interlayer insulation film. An incident angle θ (°) of incident light entering into the depletion region and a film thickness $T_{si}$ (nm) of the depletion region satisfy the following formula (1), which is also shown in FIG. 14.

$$T_{Si} \leq T_{Si}/\sin\theta \leq 100 \qquad \text{(Formula 1)}$$

According to the above method for setting an ultraviolet sensor, the attenuation length of the incident light is not more than 100 nm, and therefore, it is possible to set the ultraviolet sensor which detects an ultraviolet ray with high sensitivity without responding to visible light having a wavelength of not less than 400 nm.

BRIEF DESCRIPTION OF THE DRAWINGS

FIG. 14 is a formula used for describing the present invention.

DETAILED DISCLOSURE OF THE INVENTION

Figure 1:
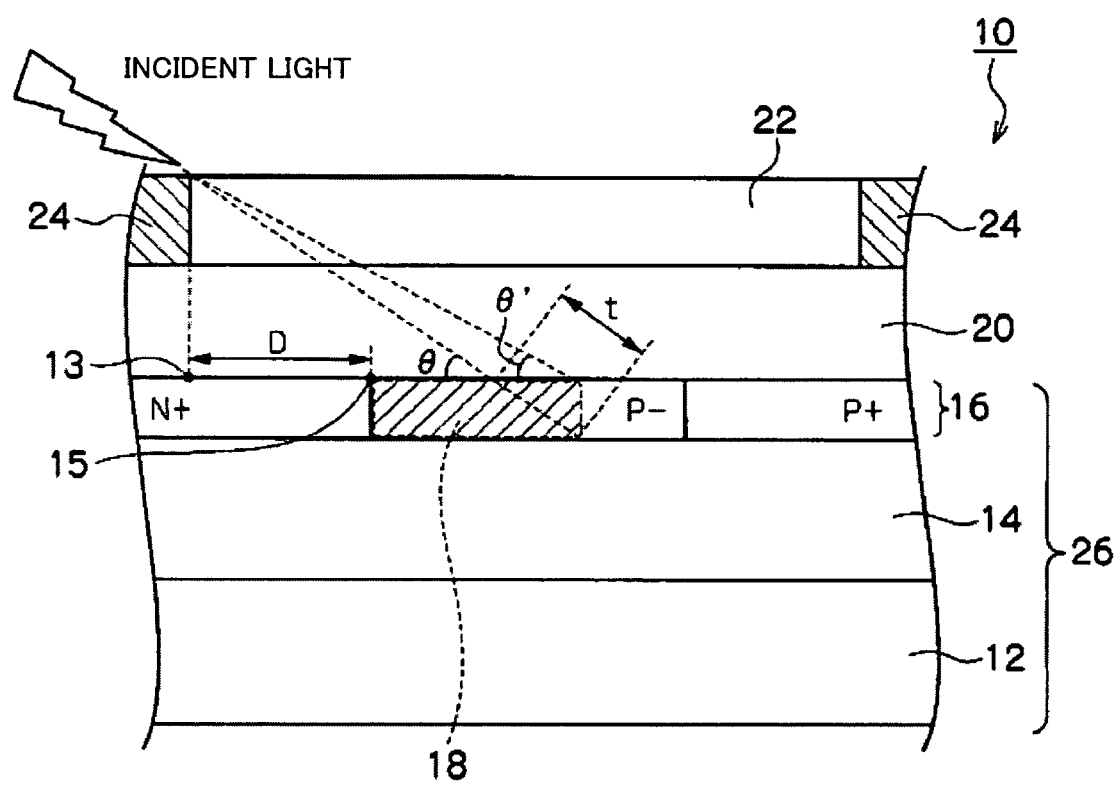
FIG. 1 is a cross-sectional view of an ultraviolet sensor in an embodiment of this invention.

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present invention is defined only by the appended claims.

Hereinafter, an embodiment of this invention is described with reference to the drawings. The shape, size, and positional relation of each composing element in the drawings are shown schematically enough to understand this invention but is not limited this invention.

<Ultraviolet Sensor>

Figure 14:
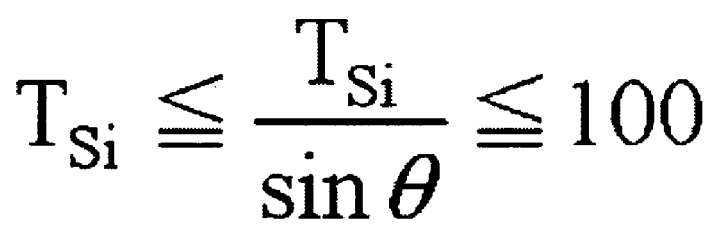

The ultraviolet sensor of this invention has an ultraviolet detection diode having a depletion region formed in an Si layer on an insulating layer, an interlayer insulating film formed on the ultraviolet detection diode, and a wiring formed on the interlayer insulating film. An incident angle θ (°) of incident light entering the depletion region and a film thickness $T_{si}$ (nm) of the depletion region satisfy the following formula (1), which is also shown in FIG. 14.

$$T_{Si} \leq T_{Si}/\sin\theta \leq 100 \qquad \text{(Formula 1)}$$

The ultraviolet sensor of this invention has a wiring for shielding incident light and a depletion region responding to the incident light. However, approach length until the incident light having entered into the depletion region abuts against an insulating layer is increased depending on the incident angle of the incident light, whereby the actual value of the film thickness of an Si layer through which the incident light is passed may be increased.

Even if the incident angle of the incident light is regulated, when the film thickness of the depletion region is not designed so as to depend on the incident angle, the film thickness is too thick and therefore the actual value of the Si film thickness is designed to be large, whereby the ultraviolet sensor may react to visible light.

As shown in this invention, the incident angle of the incident light and the film thickness of the depletion region (Si layer) satisfy the formula (1), which is also shown in FIG. 14, whereby the film thickness of the depletion region can be set in accordance with the incident angle of the incident light. Thus, the ultraviolet sensor can respond to an ultraviolet ray with high sensitivity.

Figure 11:
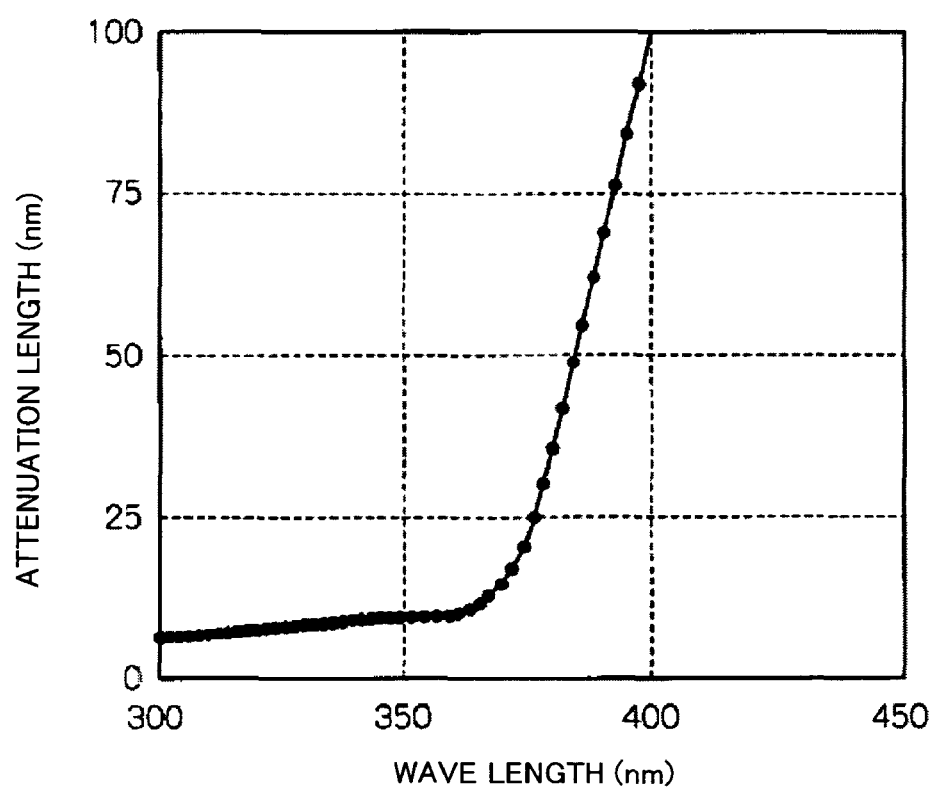
FIG. 11 is a graph showing a relation of attenuation length with respect to a wavelength of incident light in silicon (100)
Figure 12:
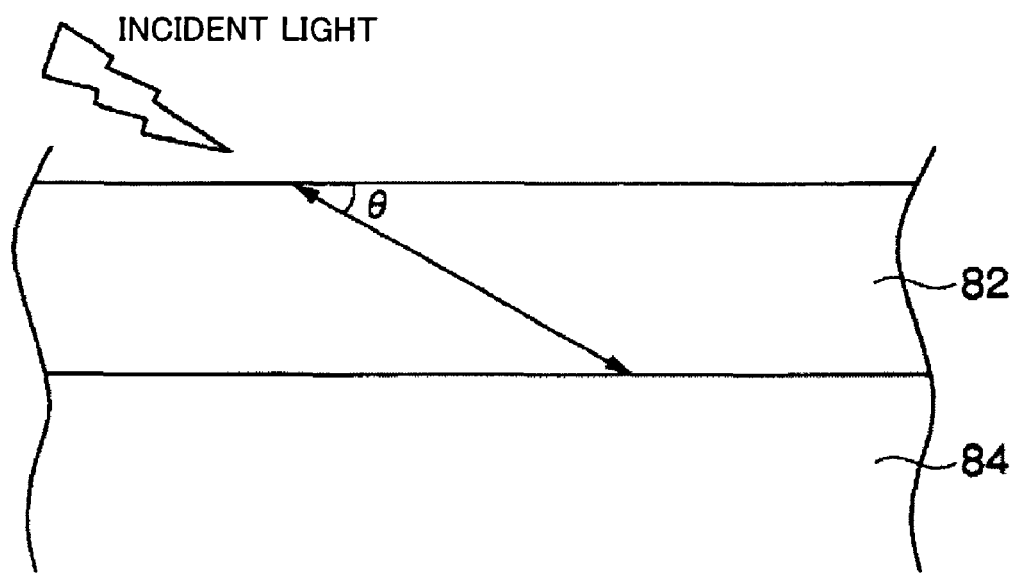
FIG. 12 is a cross-sectional view showing an angle of incident light.
Figure 13:
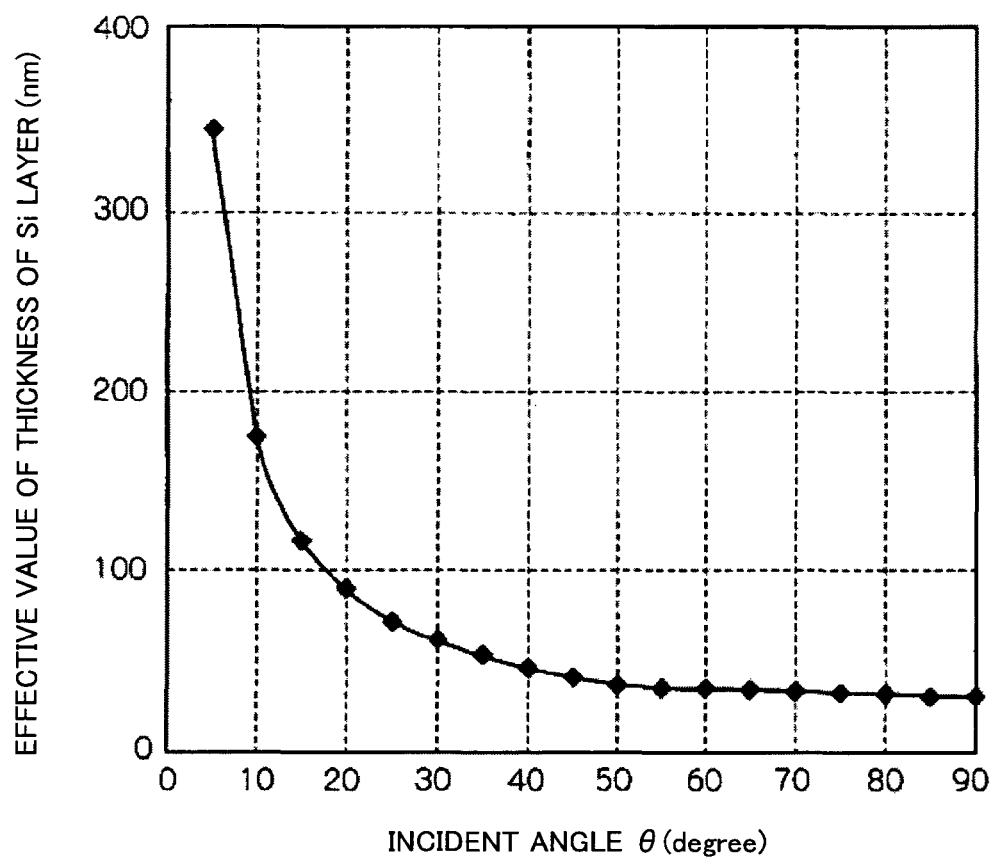
FIG. 13 is a graph showing an actual value of a film thickness of an Si layer with respect to an incident angle of incident light.

Specifically, the formula (1), which is also shown in FIG. 14 represents a relational expression between the film thickness $T_{si}$ (nm) of the depletion region (Si layer) and the incident angle θ (°) of the incident light. In the formula (1), which is also shown in FIG. 14, ($T_{si}/\sin\theta$) represents the approach length (the actual value of the Si film thickness described above) of the incident light entering at θ°, and the range is not less than the Si film thickness $T_{si}$ and not more than 100 nm. The reason the minimum value is the Si film thickness is because the actual value of the Si film thickness becomes the minimum value when the incident angle of the incident light is 90°. Thus, the maximum value of the incident angle is 90°. Meanwhile, the reason the maximum value is 100 nm is because the ultraviolet sensor can selectively respond to an ultraviolet ray of not more than 400 nm, as seen in FIG. 11.

[Constitution of Ultraviolet Sensor]

There are no particular restrictions on the constitution of the ultraviolet sensor of this invention as long as it includes an insulting layer, an Si layer, an interlayer insulating film, and a wiring layer. Hereinafter, the ultraviolet sensor of this invention is described in detail based on FIG. 1.

FIG. 1 shows a cross-sectional view of an ultraviolet sensor in the first embodiment of this invention. A substrate 26 is formed of an Si layer 12, an insulating layer 14, and an Si layer 16 which are stacked in sequence. An ultraviolet detection diode having a depletion region 18 is provided in the Si layer 16 in the substrate 26. An interlayer insulating film 20 is further stacked on the substrate 26, and a wiring 24 is provided on the interlayer insulating film 20.

In FIG. 1, "t" represents approach length (an actual value of the film thickness of the Si layer) through which incident light entering at an incident angle of θ can be passed. Namely, as the incident angle becomes shallower, the actual value is increased; meanwhile, as the incident angle becomes deeper, the actual value is reduced. For example, in the incident light entering from a upper right end part of the wiring 24 positioned on the left side in FIG. 1, the actual value becomes maximum when the incident light enters the lower right end part of the depletion region.

Figure 2:
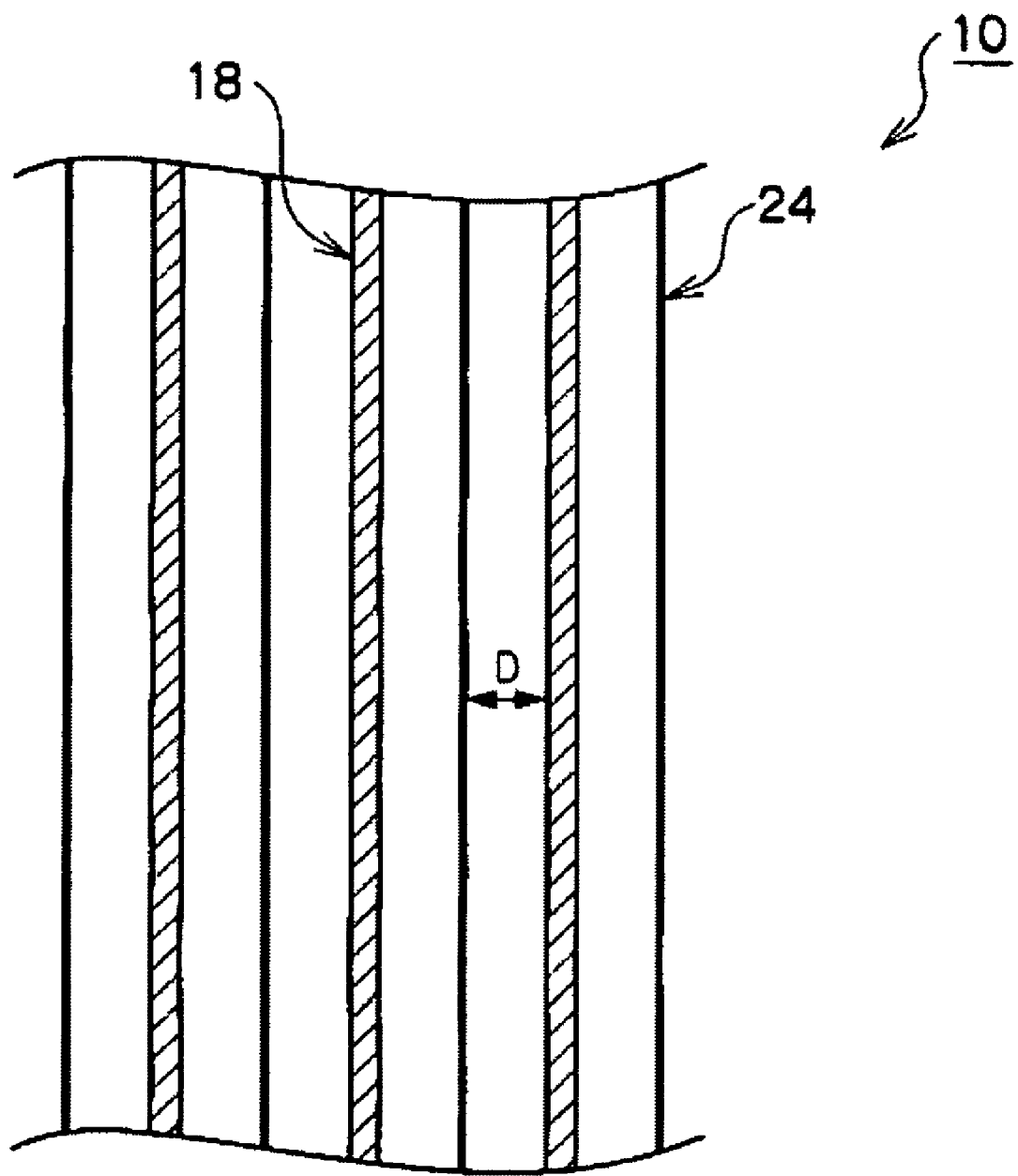
FIG. 2 is a top view of the ultraviolet sensor in the embodiment of this invention.

In the ultraviolet sensor of this invention, the depletion region and the wiring are alternatively arranged. It is preferable that a distance between an end part of the upper surface on the wiring side in the depletion region and an intersection point between a line, which is drawn from the side surface on the depletion region side in the wiring so as to be vertical with respect to the Si layer direction, and the surface of the Si layer is not less than 0.1 μm and not more than 3.92 μm, particularly not less than 0.5 μm and not more than 1.5 μm. FIG. 2 is a top view of the ultraviolet sensor of this invention. As shown in FIG. 2, the depletion region 18 and the wiring 24 are alternatively arranged at a predetermined interval, whereby the incident light entering from the lower part of the wiring at an extremely low angle can be shielded.

"The distance between the end part of the upper surface on the wiring side in the depletion region and the intersection point between the line, which is drawn from the side surface on the depletion region side in the wiring so as to be vertical with respect to the Si layer direction, and the surface of the Si layer" represents a distance D shown in FIG. 1. Namely, for example, the distance D represents a distance between the intersection point 13 between a perpendicular line, which is drawn from the right side surface of the wiring 24 on the left side in FIG. 1 toward the Si layer 16, and the surface of the Si layer 16 and a left end part 15 of the upper surface of the depletion region 18. According to this constitution, the incident angle of the incident light can be regulated. With regard to the distance between the wiring 24 on the right side in FIG. 1 and the depletion region 18, the distance D can be set in a similar manner.

Specifically, for example, in the aspect in which the incident light entering from the right end, part of the upper surface of the wiring 24, positioned on the left side in FIG. 1, to the right end part of the upper surface of the depletion region 18 at a shallow angle is shielded, the distance D can be calculated as follows. When the film thickness of the interlayer insulating film 20 is 1.0 μm, the height of the wiring 24 is 0.5 μm, and the incident angle is 20°, a total X of the distance D and the width of the depletion region 18 is 1.5/tan 20≈4.12 μm. Thus, when the width of the depletion region 18 is 0.2 μm, the distance D between the depletion region 18 and the wiring 24 is X−(the width of the depletion region)≈3.92 μm.

Figure 3:
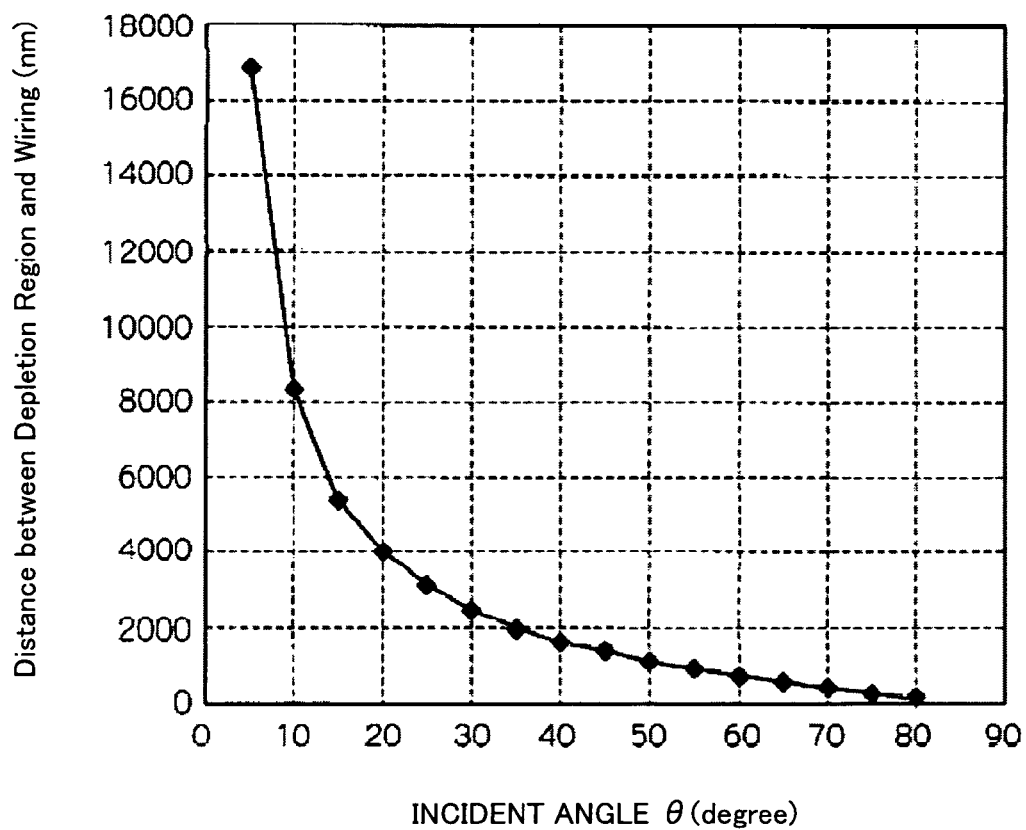
FIG. 3 is a graph showing a relation between an incident angle of incident light and a distance between a depletion region and a wiring.

If the distance D is smaller than the above value, the incident light with the incident angle of shallower than 20° can be shielded. FIG. 3 is a graph showing the relation between the incident angle of the incident light and the distance between the depletion region and the wiring. In the graph shown in FIG. 3, the film thickness of the interlayer insulating film is 1.0 μm, the height of the wiring is 0.5 μm, and the width of the depletion region is 0.2 μm. For example, this graph shows that in order to render the incident angle larger than 20°, the distance between the depletion region and the wiring may be not more than 3.92 μm.

Figure 4:
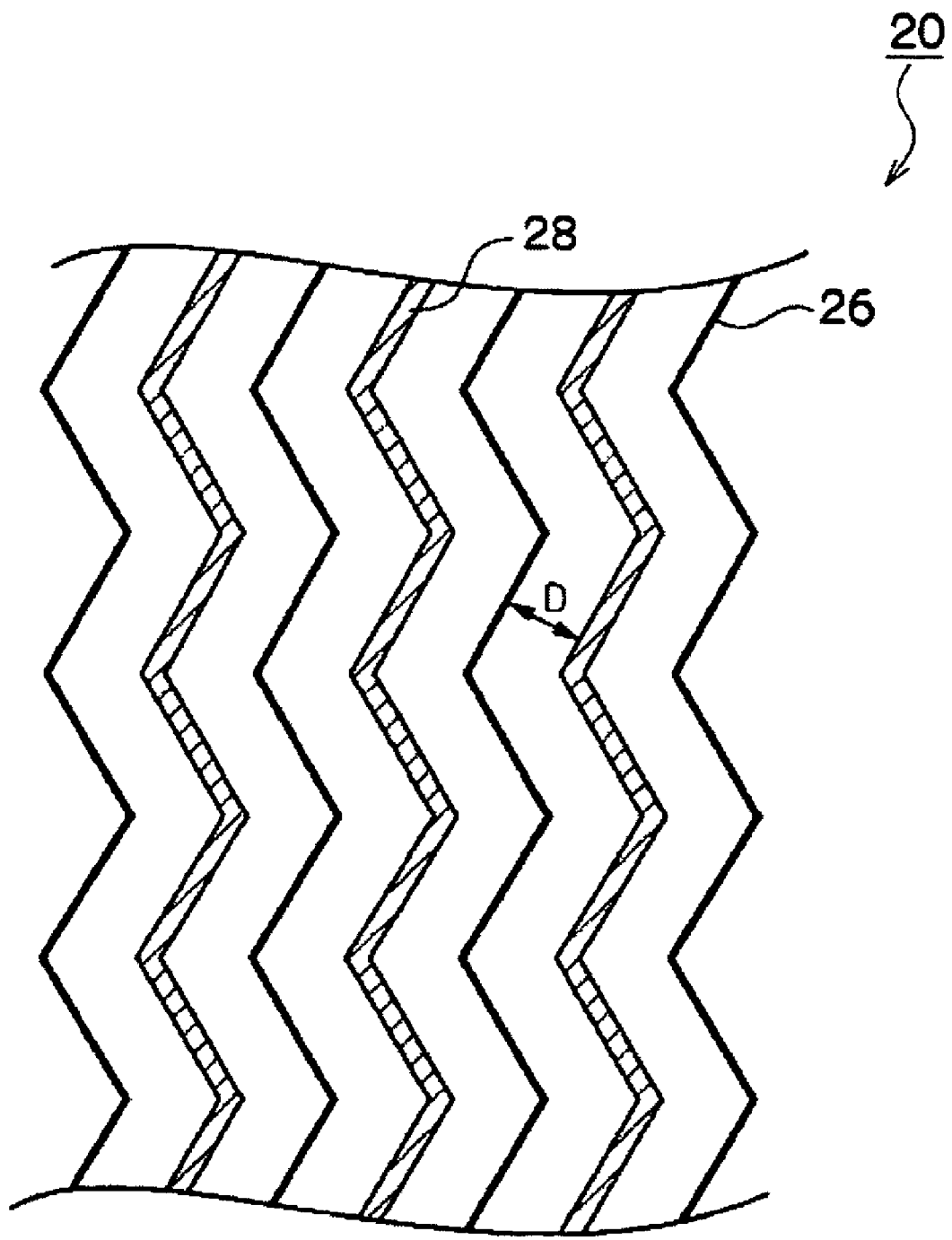
FIG. 4 is a top view of the ultraviolet sensor in the embodiment of this invention.
Figure 5:
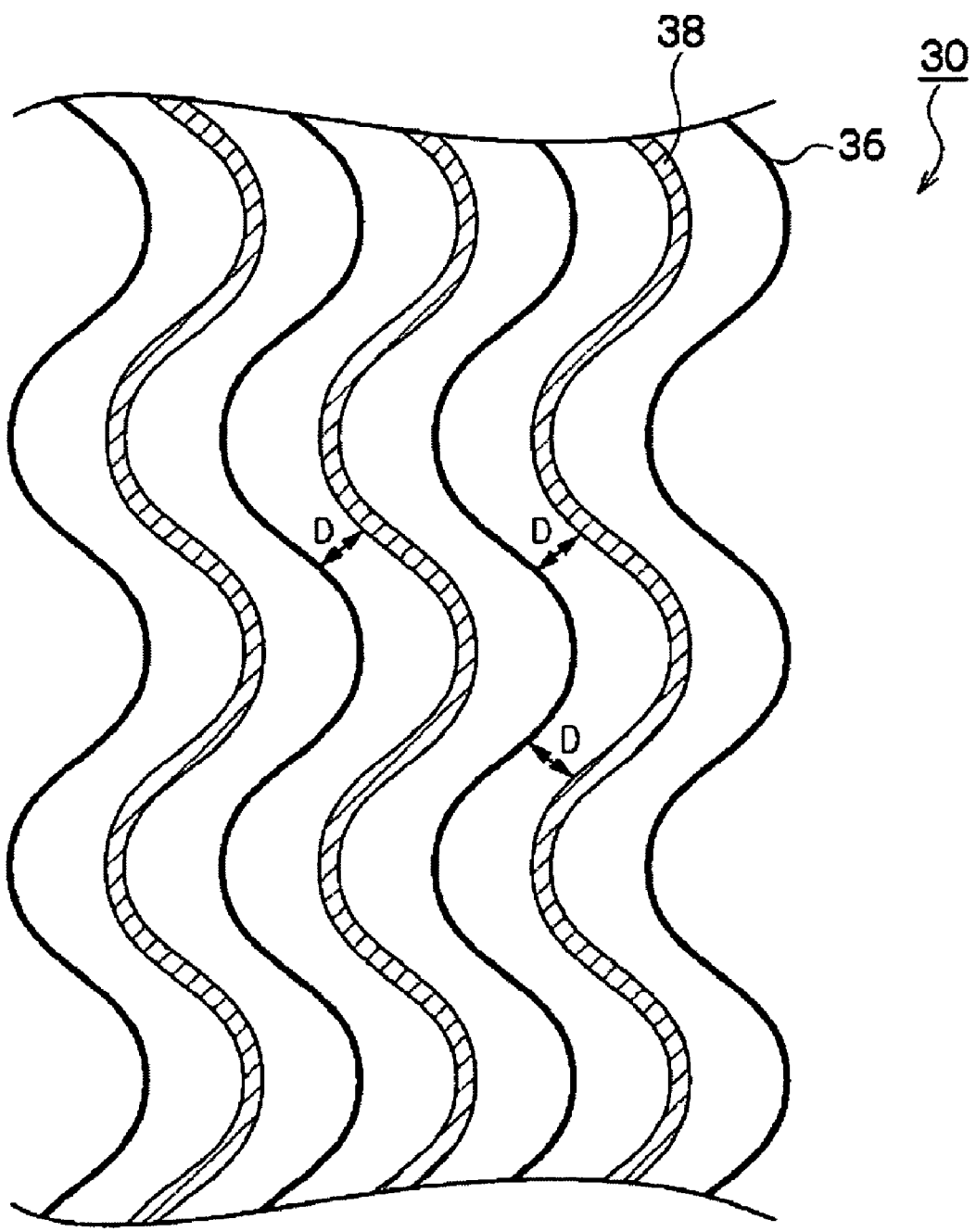
FIG. 5 is a top view of the ultraviolet sensor in the embodiment of this invention.
Figure 6:
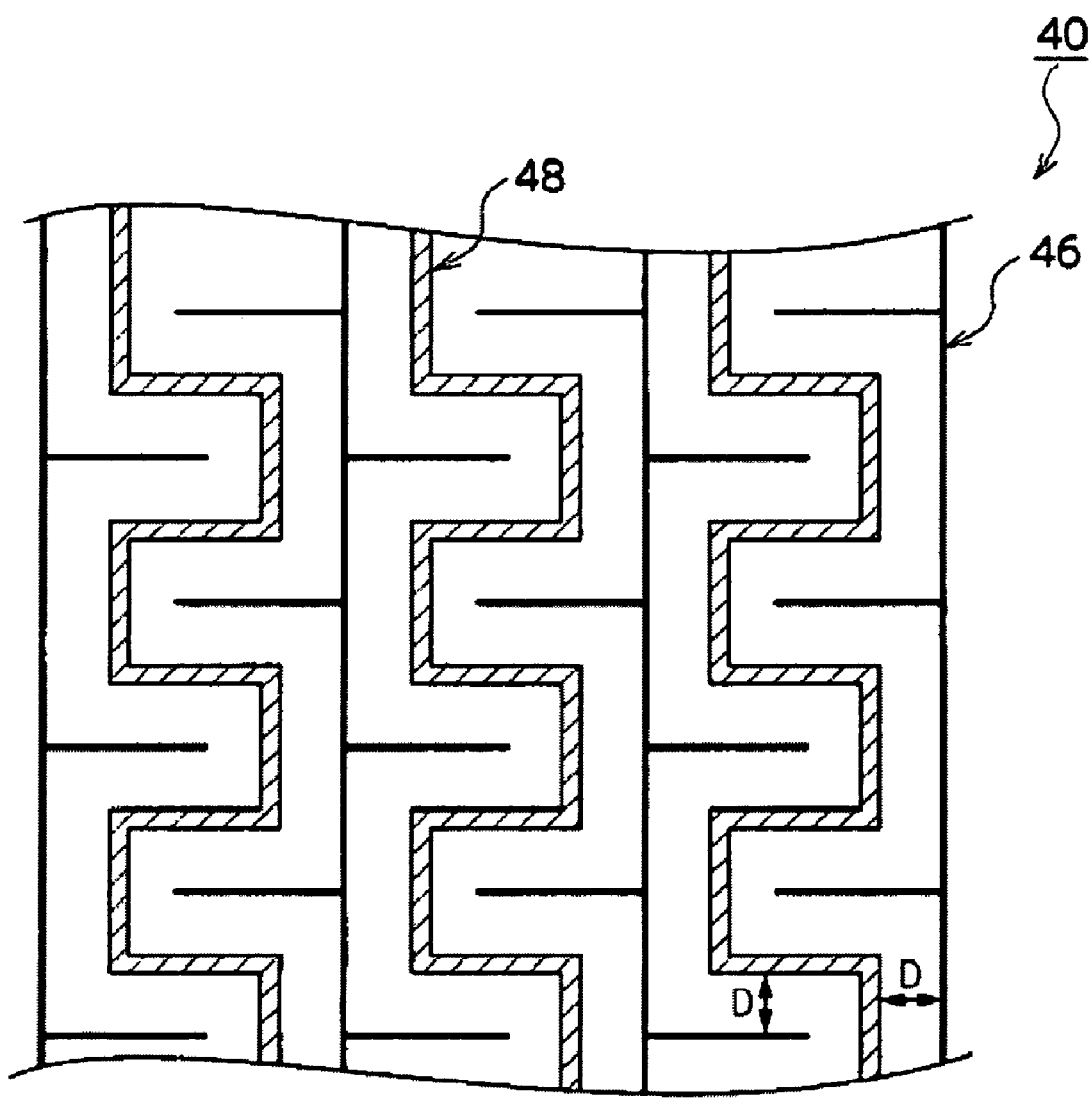
FIG. 6 is a top view of the ultraviolet sensor in the embodiment of this invention.

There are no particular restrictions on the shape of the wiring and the depletion region as viewed from the above as long as the incident angle can be regulated for the incident lights in any direction. The examples of the shape are shown in FIGS. 4 to 6. The shape may be represented by polygonal lines shown in FIG. 4, may be a circular shape shown in FIG. 5, or may be a comb shape shown in FIG. 6.

Figure 7:
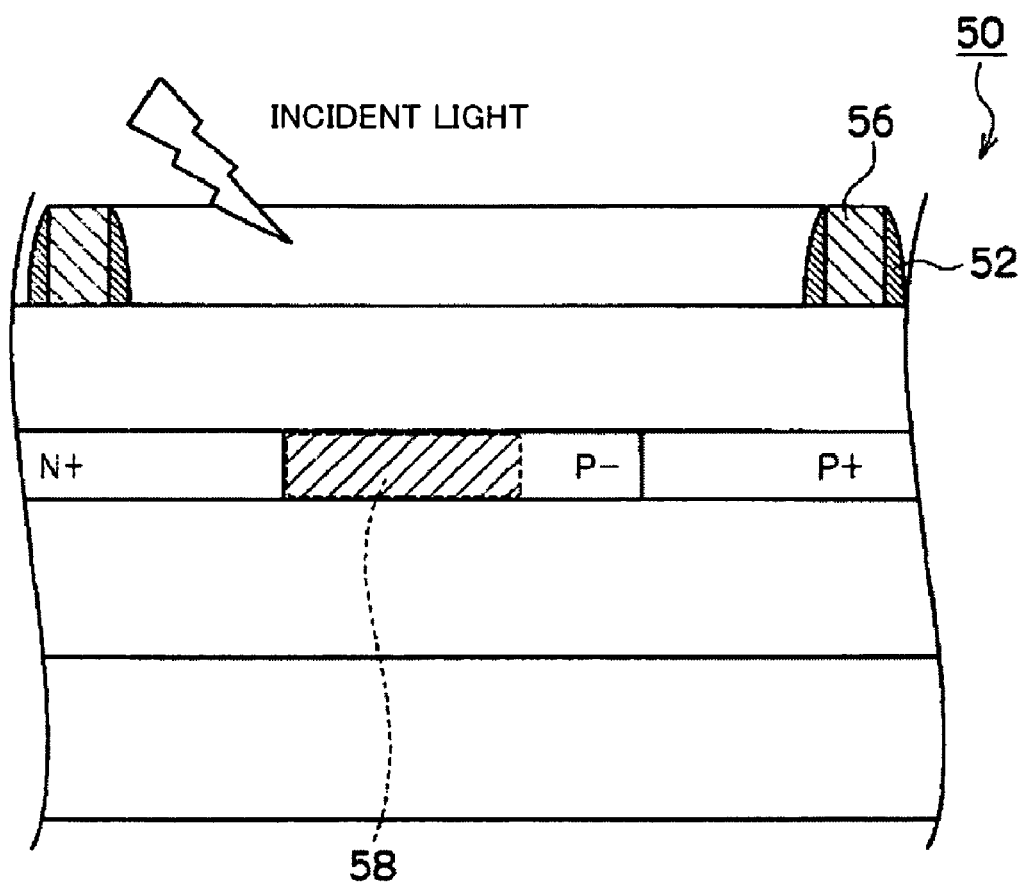
FIG. 7 is a cross-sectional view of the ultraviolet sensor in the embodiment of this invention.

In other preferable constitution, as shown in FIG. 7, an antireflection film 52 is formed on the side wall of a wiring 56. The antireflection film 52 can suppress the irregular reflection of lights reflected onto the wiring 56, and can reduce the malfunction.

Figure 8:
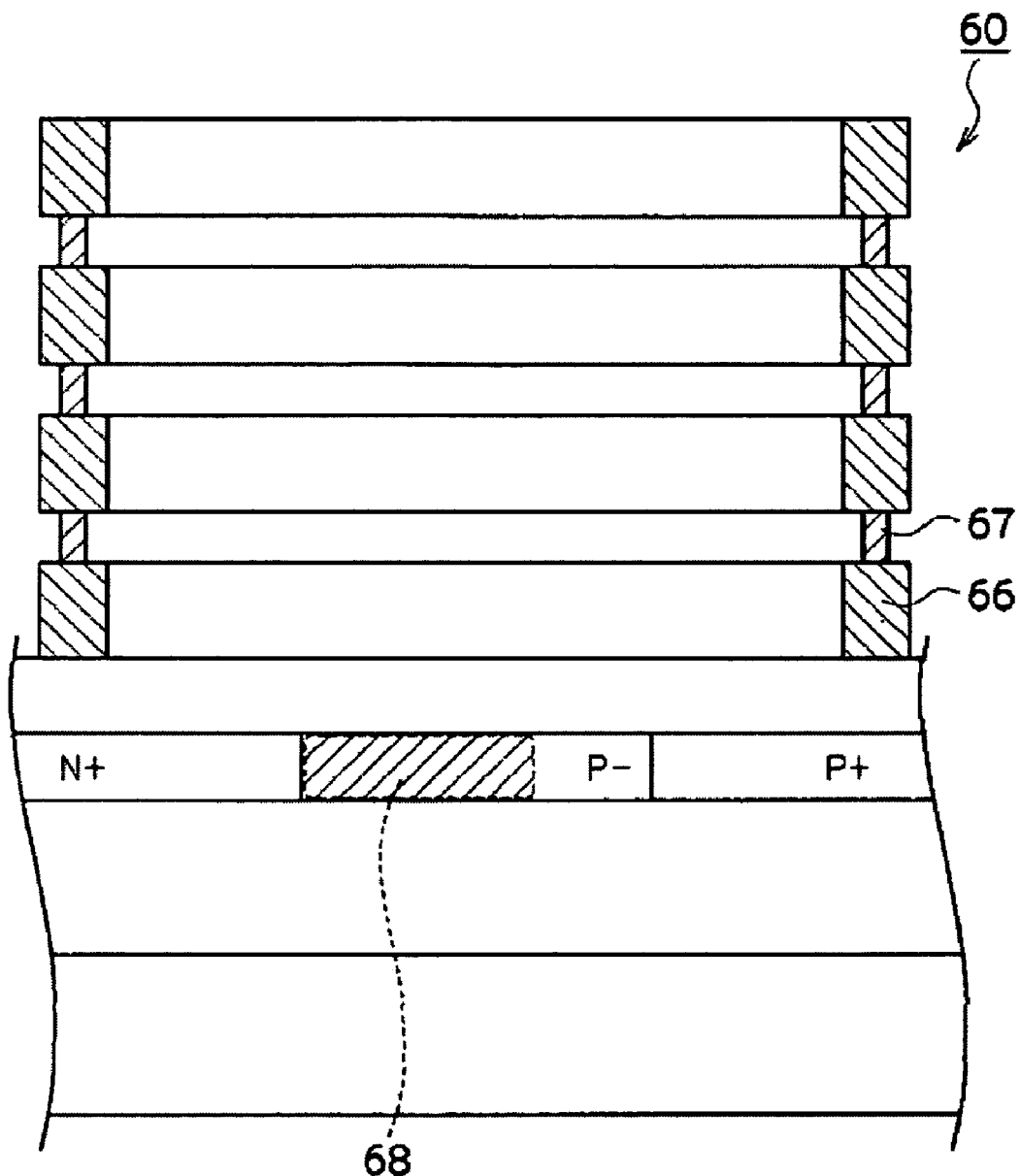
FIG. 8 is a cross-sectional view of the ultraviolet sensor in the embodiment of this invention.

Further, as shown in FIG. 8, it is preferable that the wiring has a multilayer structure. When a wiring 66 has a multilayer structure, the incident light at a low angle can be reliably shielded. It is preferable in that as the number of layers stacked in the wiring 66 becomes larger, the ultraviolet sensor reacts only to the incident light at a high angle. However, in view of the demand of reducing weight, thickness, length and size and the reduction of the manufacturing time, it is preferable that the wiring 66 has two or more layers and five or less layers.

In addition, when the wiring has a multilayer structure, the ultraviolet sensor has a structure in which a via plug 67 connects between the wirings.

Figure 9:
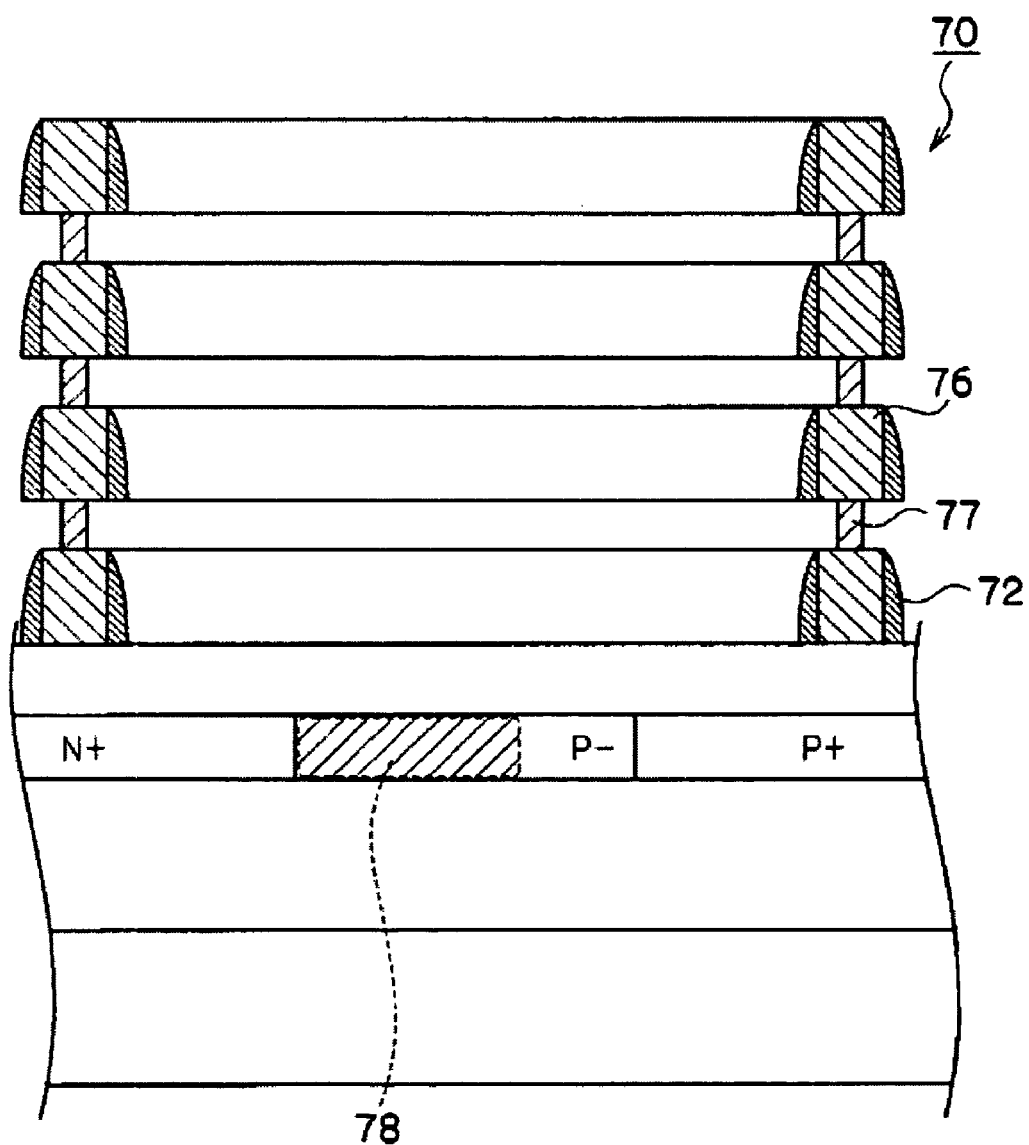
FIG. 9 is a cross-sectional view of the ultraviolet sensor in the embodiment of this invention.

In the most preferred aspect, as shown in FIG. 9, there is an ultraviolet sensor 70 in which an antireflection film 72 is provided on the side wall of a wiring 76. In this constitution, it is preferable in that the irregular reflection of lights reflected onto the wiring 76 can be suppressed, and, at the same time, the incident light at a low angle can be reliably shielded.

Hereinafter, a substrate, an ultraviolet detection diode, an interlayer insulating film, and a wiring are described in detail.
Substrate The substrate 26 of this invention is formed of the Si substrate 12, the insulating layer 14, and the Si layer 16, as shown in FIG. 1. The substrate 26 may be an SIMOX wafer produced by ion-implanting oxygen ion into an Si substrate to form a silicon oxide film, or may be a wafer obtained by oxidizing an Si substrate to bond the oxide films to each other. In addition, the insulating layer 14 may be formed of an insulating material such as a silicon nitride film, quartz, sapphire, alumina, titania, and zirconia.

The Si layer 16 is required to have a film thickness determined by the above formula (1), which is also shown in FIG. 14, and the film thickness is preferably not less than 20 nm and not more than 40 nm. If the film thickness is not more than 20 nm, the sensitivity with respect to an ultraviolet ray is degraded, and if the film thickness is not less than 40 nm, the incident light reflected onto the insulating layer 14 (reflected light) and the incident light are multiply scattered to cause a malfunction. Thus, when the film thickness is in the above range, the ultraviolet sensor can respond to an ultraviolet ray with high sensitivity.
Ultraviolet Detection Diode In the ultraviolet detection diode of this invention, a depletion region is sandwiched between an $N^+$ diffusion layer and a $P^+$ diffusion layer, and a $P^-$ diffusion layer is provided between a depletion layer and the $P^+$ diffusion layer. The width of the depletion layer depends on the impurity concentration in the $P^-$ diffusion layer. The concentration in the $P^-$ diffusion layer is preferably normally $1\times10^{16}/cm^3$ to $1\times10^{18}/cm^3$, and it is preferable that the width of the depletion region in this range is not less than 0.05 μm and not more than 0.3 μm. If the width is not more than 0.05 μm, the sensitivity with respect to an ultraviolet ray is degraded, and, in view of the impurity concentration in the $P^-$ diffusion layer, it is difficult to provide a width of not less than 0.3 μm.
Interlayer Insulating Film Although there are no particular restrictions on the insulating film of this invention as long as it is an insulating material, as the examples, there are oxide silicon, phosphosilicate glass (PSG), boron phosphosilicate glass (BPSG), fluorine-doped silicon glass (FSG), and a low-dielectric constant material equivalent to these glasses.

The film thickness of the interlayer insulating film is preferably in the range of not less than 0.5 μm to not more than 1.5 μm, as with the prior art.

Wiring

The wiring of this invention is provided for shielding the incident light at a specific incident angle. Thus, there are no particular restrictions on the wiring as long as the wiring has a light-shielding property. However, the wiring is preferably formed of metal, alloy, metal compound, or equivalent. For example, there are TiN, W, Al, Cu, and so on.

The height of the wiring is preferably in the range of not less than 0.3 μm to not more than 1.0 μm, as with the normal case.

As shown in FIGS. 7 and 9, when the antireflection film is provided on the side wall of the wiring, one or plural layers of titanium, titanium nitride, tantalum, tantalum nitride, or alloy thereof are formed as the antireflection film. The film thickness is preferably in the range of not less than 10 nm to not more than 200 nm, in view of easiness of the process setting.

As shown in FIGS. 8 and 9, when the wiring has a multilayer structure, the height of the wiring in each layer is preferably in a similar range to the above mentioned range.

<Method for Setting Ultraviolet Sensor>

In a method for setting an ultraviolet sensor of this invention, as above mentioned, the film thickness $T_{si}$ of the depletion region is suitably adjusted in accordance with the incident angle θ of the incident light, whereby the ultraviolet sensor can be set so that "t" in FIG. 1 is set to be not more than 100 nm. When "t" is assumed to be the attenuation length shown in FIG. 11, the attenuation length is set to be not more than 100 nm and therefore the incident light of not more than 400 nm can be selectively entered into the depletion region. Thus, it becomes possible to set the film thickness of the depletion region in the ultraviolet sensor which can detect an ultraviolet ray with high sensitivity.

<Method for Manufacturing Ultraviolet Sensor>

In the method for manufacturing an ultraviolet sensor of this invention, the ultraviolet sensor can be manufactured by a similar process to the conventional thin film process. An example is shown as follows.

An SOI substrate in which the film thickness of an SOI layer is 30 μm is provided, P of not less than $5\times10^{14}/cm^3$ and not more than $1\times10^{16}/cm^3$ is implanted into the $N^+$ diffusion layer so that the depletion region is sandwiched in the middle of the SOI layer, B of not less than $5\times10^{16}/cm^3$ and not more than $1\times10^{16}/cm^3$ is implanted into the $P^+$ diffusion layer, and B of not less than $1\times10^{12}/cm^3$ and not more than $5\times10^{14}/cm^3$ is implanted into the $P^-$ diffusion layer, whereby a diode for detecting an ultraviolet ray is formed. Thereafter, an interlayer insulating film of not less than 0.5 μm and not more than 1.5 μm is formed by a CVD method. Next, a protective layer is formed by the conventional method so as to have a film thickness of not less than 0.3 μm and not more than 1.0 μm, and an opening is provided by the conventional dry etching. Finally, the opening is deposited with metal by the CVD method, and the surface is polished by CMP to form a wiring.

Incidentally, as shown in FIGS. 7 and 9, in order to form the antireflection film on the side wall of the wiring, the wiring is processed by etching or the like, and thereafter the antireflection film is formed by a process such as CVD. In addition, in order to provide a multilayer structure in the wiring, the formation of a protective layer, the deposition of metal, and the polishing may be repeatedly performed to form the wiring.

EXAMPLES

Example 1

An ultraviolet sensor 10 shown in FIG. 1 is manufactured by the above described method so as to satisfy the following conditions:

| | |
|---|---|
| Film thickness of SOI layer | 30 μm |
| Height of wiring (material: aluminum) | 0.6 μm |
| Film thickness of interlayer insulating film (material: $SiO_2$) | 0.8 μm |
| Width of depletion region | 0.3 μm |
| Distance between depletion region and wiring (incident light at an incident angle of not more than 20° is shielded) | 3.54 μm |

Examples 2 to 7

The ultraviolet sensors in Examples 2 to 4 are manufactured by a similar method to Example 1 with the exception that the wiring and the depletion region have the shape shown in FIGS. 4 to 6 as viewed from the above.

The ultraviolet sensor in Example 5 is manufactured by a similar method to Example 1 with the exception that after the formation of the wiring, the antireflection film, formed of a silicon oxide nitride film and so on, is formed on the side wall of the wiring by the CVD process, as shown in FIG. 7.

Figure 10:
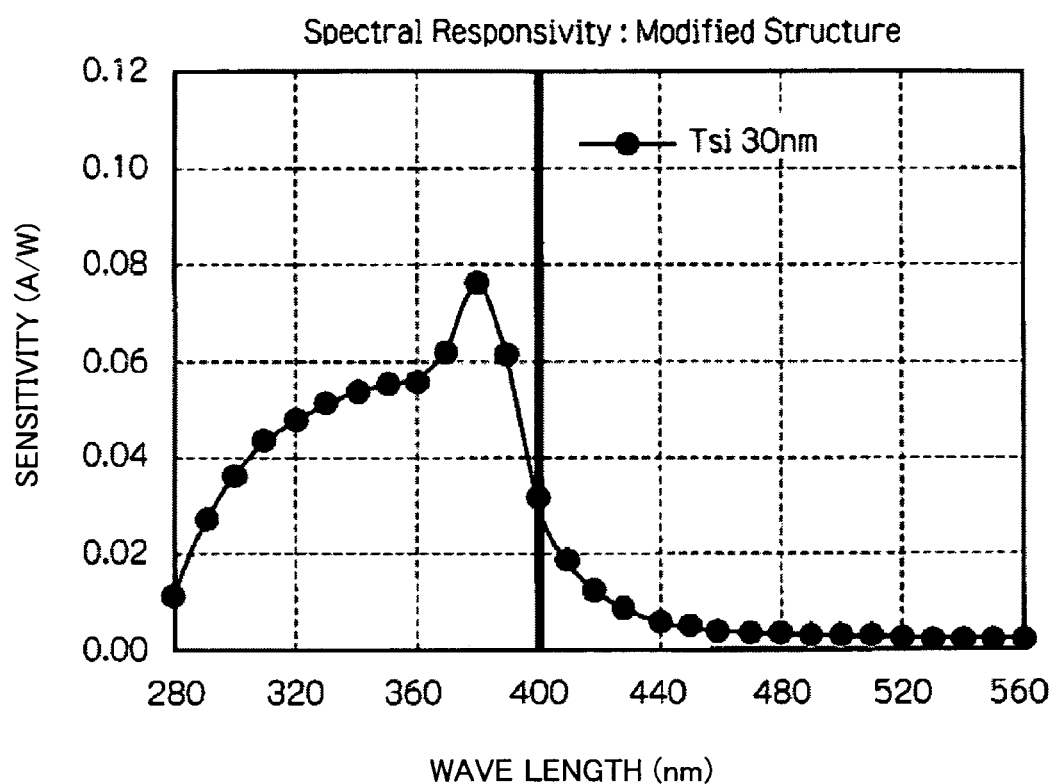
FIG. 10 is a graph showing a relation of sensitivity with respect to a wavelength of incident light when $T_{si}$ is 30 nm in the ultraviolet sensor of this invention.

The ultraviolet sensor in Example 6 is manufactured by a similar method to Example 1 with the exception that the formation of the wiring and the formation of the insulating film are repeatedly performed whereby four layers are stacked in the wiring, as shown in FIG. 8. The result is shown in FIG. 10.

The ultraviolet sensor in Example 7 is manufactured by a similar method to Example 1 with the exception that after the formation of each wiring, the antireflection film, formed of a silicon oxide nitride film and so on, is formed on the side wall of the wiring by the CVD process, as shown in FIG. 9.

In any Examples, it has been revealed that the ultraviolet sensor responds to an ultraviolet ray with high sensitivity. In Examples 5 to 7 especially, the sensitivity is high, and, in Examples 6 and 7, the sensitivity is especially high. FIG. 10 shows a graph showing the relation of sensitivity with respect to the wavelength of the incident light when $T_{si}$ is 30 nm in the ultraviolet sensor in FIG. 7. The result in FIG. 10 shows that the sensitivity is high for the incident light with a wavelength of not more than 400 nm and the incident light with a long wavelength of not less than 400 nm is suppressed.

Needless to say, the present embodiments are not interpreted as limiting and can be realized within the range complying with the requirements of the present invention.

What is claimed is:
1. An ultraviolet sensor comprising:
   an ultraviolet detection diode having a depletion region formed in an Si layer on an insulating layer;
   an interlayer insulating film formed on the ultraviolet detection diode; and
   a wiring formed on the interlayer insulating film, wherein an incident angle θ(°) of incident light entering into the depletion region and a film thickness $T_{Si}$ (nm) of the depletion region satisfy the following formula (1):

$$T_{Si} \leq T_{Si}/\sin\theta \leq 100$$

2. The ultraviolet sensor according to claim 1, wherein
the depletion region and the wiring are alternatively arranged, and
a distance between an end part of the upper surface on the wiring side in the depletion region and an intersection point between a line, which is drawn from the side surface on the depletion region side in the wiring so as to be vertical with respect to the Si layer direction, and the surface of the Si layer is not less than 0.1 and not more than 3.92 μm.

3. The ultraviolet sensor according to claim 1, wherein an antireflection film is formed on a side wall of the wiring.

4. The ultraviolet sensor according to claim 1, wherein a plurality of the wirings are stacked.

5. An ultraviolet sensor comprising:
an ultraviolet detection diode having a depletion region formed in an Si layer on an insulating layer;
an interlayer insulating film formed on the ultraviolet detection diode; and
a wiring formed on the interlayer insulating film,
wherein the wiring and a film thickness $T_{Si}$ (nm) of the depletion region are configured such that, for all available values of an incident angle θ (°) of incident light entering into the depletion region, the incident angle and the film thickness satisfy the following formula (1):

$$T_{Si} \leq T_{Si}/\sin\theta \leq 100$$

6. The ultraviolet sensor according to claim 5, wherein
the depletion region and the wiring are alternatively arranged, and
a distance between an end part of the upper surface on the wiring side in the depletion region and an intersection point between a line, which is drawn from the side surface on the depletion region side in the wiring so as to be vertical with respect to the Si layer direction, and the surface of the Si layer is not less than 0.1 μm and not more than 3.92 μm.

7. The ultraviolet sensor according to claim 5, wherein an antireflection film is formed on a side wall of the wiring.

8. The ultraviolet sensor according to claim 5, wherein a plurality of the wirings are stacked.

* * * * *